(12) United States Patent
Hsueh et al.

(10) Patent No.: US 6,687,162 B1
(45) Date of Patent: Feb. 3, 2004

(54) DUAL REFERENCE CELL FOR SPLIT-GATE NONVOLATILE SEMICONDUCTOR MEMORY

(75) Inventors: Sheng-Hsiung Hsueh, San Jose, CA (US); Ganshu Ben Lee, Santa Clara, CA (US); Loc Bao Hoang, San Jose, CA (US); Chun-Mail Liu, San Jose, CA (US); Albert V. Kordesch, San Jose, CA (US)

(73) Assignee: Winbond Electronics Corporation, Hsin Chu (TW)

( * ) Notice: Subject to any disclaimer, the term of this patent is extended or adjusted under 35 U.S.C. 154(b) by 0 days.

(21) Appl. No.: 10/126,450

(22) Filed: Apr. 19, 2002

(51) Int. Cl.[7] .............................................. G11C 16/06
(52) U.S. Cl. ................................ 365/185.21; 365/185.2
(58) Field of Search ......................... 365/185.2, 185.21, 365/205, 207, 208, 210

(56) References Cited

U.S. PATENT DOCUMENTS 5,717,632 A * 2/1998 Richart et al. ............ 365/185.2
6,317,362 B1 * 11/2001 Nomura et al. ........... 365/185.2
6,411,549 B1 * 6/2002 Pathak et al. ............. 365/185.2

* cited by examiner

Primary Examiner—Son Mai
(74) Attorney, Agent, or Firm—Dinh & Associates

(57) ABSTRACT

Techniques to more accurately read values stored in data cells. In an aspect, one reference cell is provided for each group of data cells having similar configuration (e.g., similar layout and orientation). For split-gate memory cells arranged in pairs, each pair includes two data cells implemented as mirrored image of one another. Two reference cells may then be used, one reference cell for each data cell in a pair. In another aspect, the data paths for the reference and data cells for read operation are matched. This matching may be achieved by using the same circuit design for the data and reference sense amplifiers, using the same layout and orientation for the sense amplifiers, matching the lines for the two data paths, matching the structure (e.g., length and width) and the diffusion region (e.g., doping concentration and contact) for the sense amplifiers and lines, and so on.

20 Claims, 7 Drawing Sheets

DUAL REFERENCE CELL FOR SPLIT-GATE NONVOLATILE SEMICONDUCTOR MEMORY

BACKGROUND OF THE INVENTION

The present invention relates generally to nonvolatile semiconductor memory, and more specifically to techniques for reading data from split-gate type of nonvolatile semiconductor memory cells using multiple reference cells.

The purpose of storing data into a memory cell is so that at some later time the data can be read back again. During a read operation, the bit in the memory cell is determined to be equal to a logic high ("1") or a logic low ("0"). This is typically accomplished by comparing a value (e.g., a current) for a data cell being read with a reference value of a known cell, which is often referred to as a reference cell. The data value stored in the data cell is determined to be a logic high if the value of the data cell is higher than the reference value of the reference cell, and a logic zero otherwise.

A reference cell is typically designed to have a structure very similar to that of the data cells in the memory array. This design allows the characteristics of the reference cell to match those of the data cells over process variations during fabrication. This design further allows the reference cell to track the data cells over temperature and power supply variations during normal use.

The use of a single reference cell for read operation may not provide high performance for certain memory designs. For example, for a split-gate type of nonvolatile memory, the data cells are arranged in pairs and the first data cell in each pair may behave differently from the second data cell in the pair. The first and second data cells in each pair may be arranged (i.e., laid out) as mirror image of one another. Because of this mirrored arrangement, manufacturing imperfections (e.g., mask misalignment) can result in differences in the physical layouts between the first and second cells in the pair. The physical differences may then result in different electrical characteristics for the first and second cells in the pair.

For the split-gate type nonvolatile memory design, if the reference cell is implemented similar to the first cell, then it may match the process variations and track the temperature changes of all first cells very well. However, the matching and tracking may be poor for the second cells. As a result, performance will likely degrade if the reference cell is used to determine the data stored in the second cells.

As can be seen, techniques to accurately read data from split-gate type memory cells potentially having different characteristics are highly desirable.

SUMMARY OF THE INVENTION

The invention provides techniques to more accurately read values stored in data cells. In an aspect, multiple reference cells are used to provide reference values for reading data cells. One reference cell is provided for each group of data cells having similar configuration (e.g., similar layout and orientation). For split-gate memory cells, two reference cells may be used, with one reference cell being used for a first set of memory cells having a first configuration and another reference cell being used for a second set of memory cells having a second configuration (which may be a mirrored image of the first configuration). In general, any number of reference cells may be used to provide reference values for any number of different memory cell configurations.

In another aspect, techniques are provided to better match the data paths for the reference and data cells for read operation. The values provided by the reference and data cells are typically amplified by respective sense amplifiers and then compared by a comparator. Any mismatch between the two data paths for the values from the data and reference cells may distort the values received at the comparator, and may result in erroneous detection.

The two data paths for the data and reference values may thus be matched. This matching may be achieved by (1) using the same circuit design for the data and reference sense amplifiers, (2) using the same layout and orientation for the sense amplifiers, (3) matching the lines for the two data paths, (4) matching the poly-silicon structure (e.g., length and width) and the diffusion region (e.g., doping concentration and contact) for the sense amplifiers and lines, and so on.

Various other aspects, embodiments, and features of the invention are also provided, as described in further detail below.

The foregoing, together with other aspects of this invention, will become more apparent when referring to the following specification, claims, and accompanying drawings.

DESCRIPTION OF THE SPECIFIC EMBODIMENTS

Figure 1:
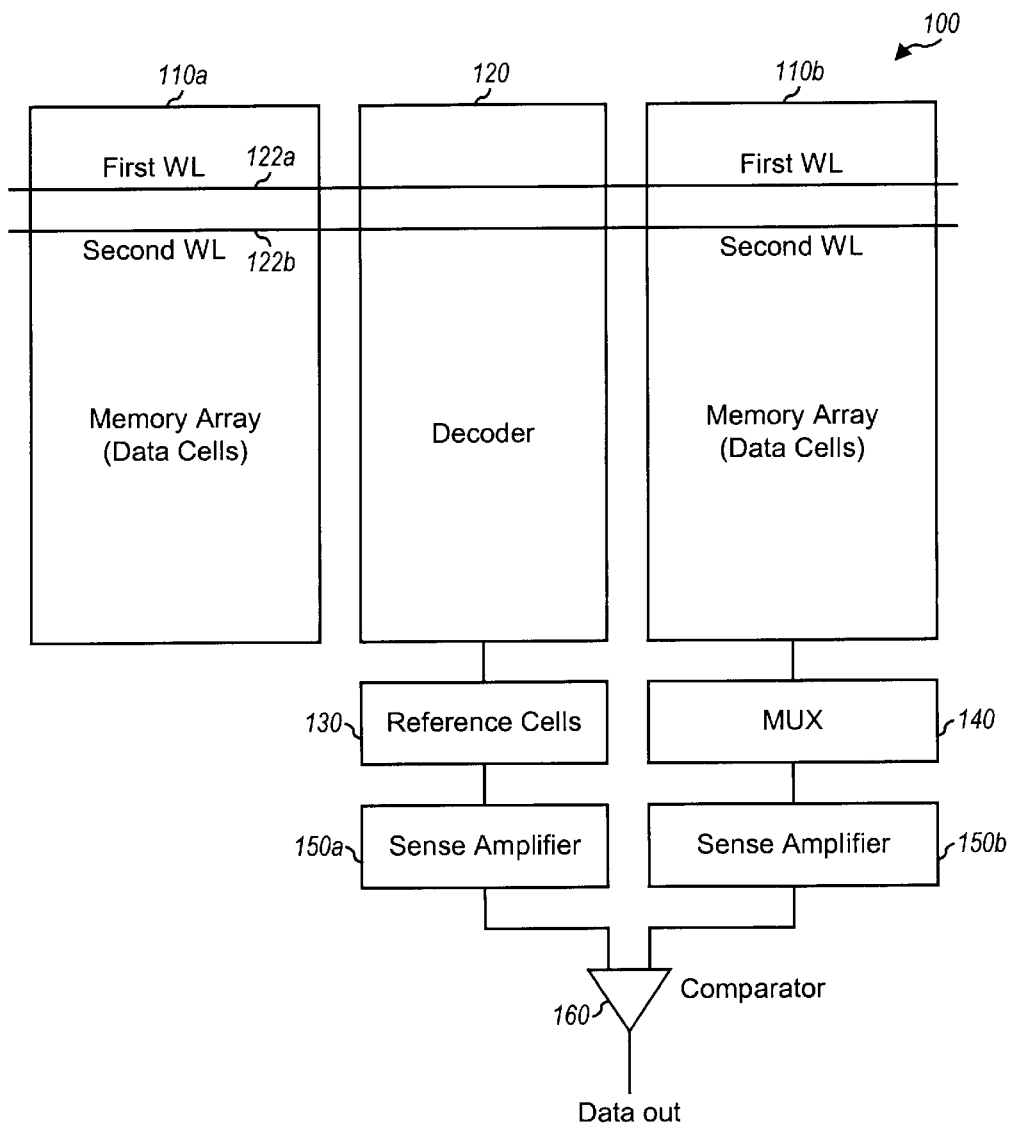
FIG. 1 is an overall block diagram of a nonvolatile memory subsystem capable of implementing various aspects and embodiments of the invention.

FIG. 1 is an overall block diagram of a nonvolatile memory subsystem 100 capable of implementing various aspects and embodiments of the invention. Memory subsystem 100 includes a number of memory arrays 110, each of which includes a number of memory cells used to store data. A decoder 120 receives and decodes a memory address for a particular data cell to be read, and selects a row of memory cells in a memory array by asserting a corresponding word line 122. In an embodiment, the data cells are arranged in pairs and, for each data cell pair, a first word line 122a is used to select a first cell in the pair and a second word line 122b is used to select a second cell in the pair.

An array of reference cells 130 provides reference values used for reading data from the data cells. In accordance with an aspect of the invention, depending on the particular data cell being read (e.g., a first cell or a second cell), the reference value from the appropriate reference cell is provided to a reference cell sense amplifier 150a.

A multiplexer (MUX) 140 selects a desired memory cell from the selected row of memory cells and routes the value from the selected cell to a data sense amplifier 150b. Sense amplifiers 150a and 150b amplify their respective input values and provide amplified and buffered values to two inputs of a comparator 160. Comparator 160 then compares the two received values and provides a digital output value based on the result of the comparison. Specifically, the comparator provides a logic high value as the digital output if the value from the data cell is larger than the value from the reference cell, and provides a logic low value otherwise.

Figure 2:
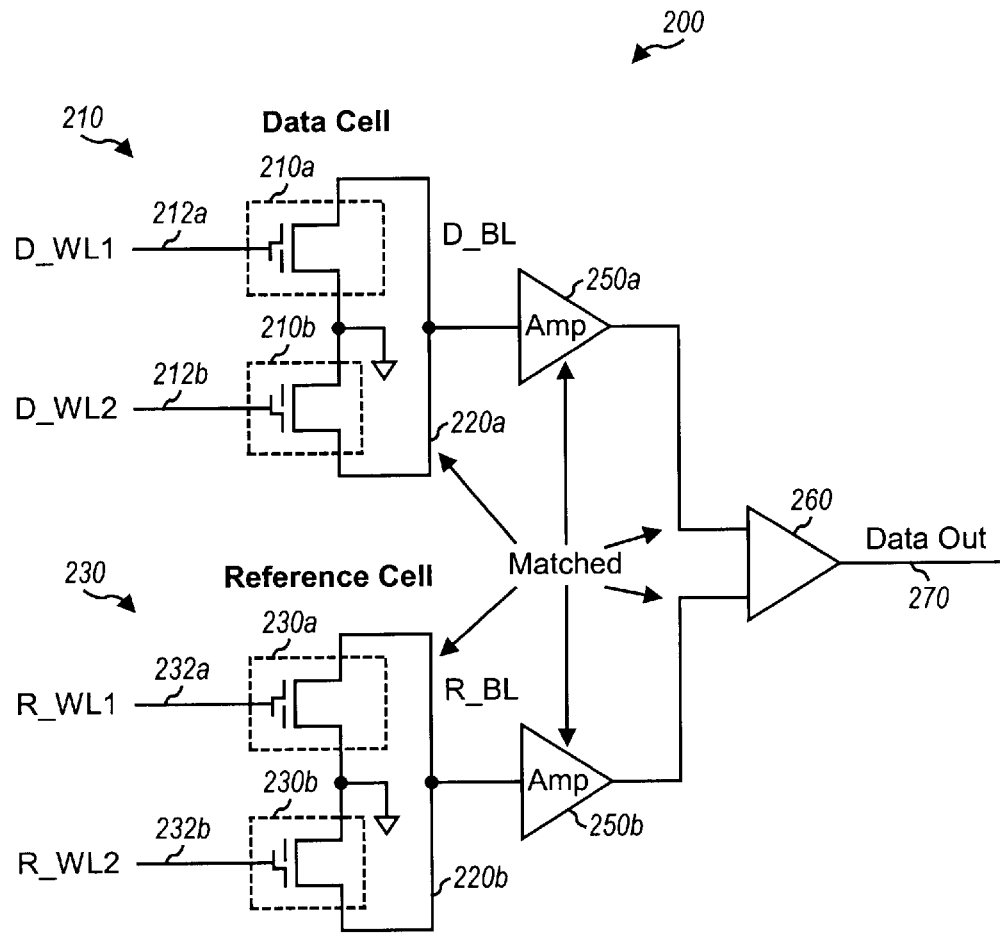
FIG. 2 is a diagram of an embodiment of the circuits used for reading data in the memory subsystem.

FIG. 2 is a diagram of an embodiment of the circuits used for reading data in memory subsystem 100. A data cell pair 210 includes two data cells 210a and 210b, each of which may be used to store a bit of data and is further associated with a respective memory address. Data cell pair 210 is typically one of many pairs in a memory array. First and second data cells 210a and 210b are located next to each other in memory array 110.

The data stored in first data cell 210a is accessed by asserting a first word line (D_WL1) 212a, and the data stored in second data cell 210b is accessed by asserting a second word line (D_WL2) 212b. When the address of a particular memory cell is decoded, only one word line is asserted by decoder 120, corresponding to the specific row of the memory array where the memory cell is located. If first word line 212a is asserted, data cell 210a is selected and its stored value (e.g., a particular charge) is provided via a bit line (D_BL) 220a to a data sense amplifier 250a. Since only one word line 212a or 212b is asserted at any given moment, only one data cell (i.e., either data cell 210a or 210b) drives data onto bit line 220a. Data sense amplifier 250a amplifies the value on bit line 220a and provides the sensed value to the first input of a comparator 260.

Correspondingly, only one reference word line 232a or 232b is asserted at any given moment, and the reference value from the selected reference cell 230a or 230b is provided via a bit line (R_BL) 220b to a reference sense amplifier 250b. Amplifier 250b then amplifies the value on bit line 220b and provides the sensed value to the second input of comparator 260.

Comparator 260 compares the two received values and provides a high logic value on a data out line 270 if the value on the first input (from the data cell) is greater than the value on the second input (from the reference cell). Conversely, a low logic value is provided on data out line 270 if the value on the first comparator input is less than the value on the second comparator input. The difference in the values from data cell 210 and reference cell 230 is typically small in magnitude (e.g., in the order of milli-volts). Comparator 260 is thus designed with high sensitivity and is typically able to detect a difference of, e.g., a few hundred milli-volts between the two inputs.

Because of the small differential value between the data and reference cells, any noise introduced by sense amplifiers 250a and 250b or any mismatches in the components/ circuits/lines in the data paths from the cells to comparator 260 may distort the original differential value and may result in erroneous detection of the value stored in the data cell. Techniques to match the data paths to provide improved performance are described below.

Figure 3:
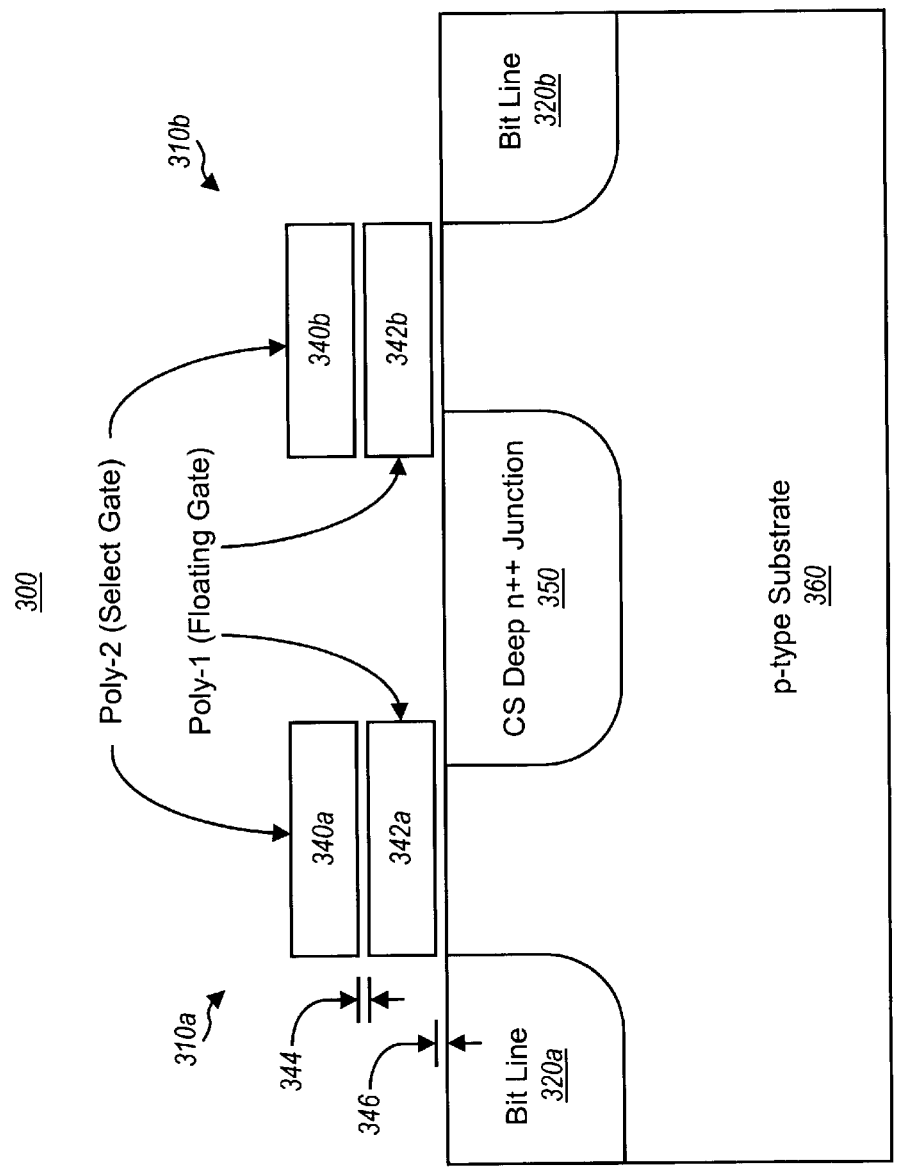
FIG. 3 shows a cross sectional view of a pair of memory cells implemented using stacked gate technology.

FIG. 3 shows a cross sectional view of a pair of memory cells 300 implemented using stacked gate technology. Memory cell pair 300 includes two memory cells 310a and 310b, each of which is implemented with a stacked gate transistor having a source that couples to common source (CS) line 350, a stacked gate that couples to a word line, and a drain that couples to a bit line 320. The stacked gate is implemented with two poly-silicon gates 340 and 342 stacked on top of each other. Top gate 340 is a select gate that turns the transistor on or off, and bottom gate 342 is a floating gate that stores a data value for the memory cell.

Select gate 340 is separated from floating gate 342 by an isolation oxide layer 344. The thickness of isolation oxide layer 344 affects the amount of voltage needed to be applied to select gate 340 to turn on the transistor. A thicker isolation oxide layer 344 requires a higher voltage to be applied to turn on the transistor, whereas a thinner isolation oxide layer 344 allows a lower voltage to be applied to turn on the transistor. Floating gate 342 is fabricated on top of an isolation oxide layer 346.

To program (or write) a logic low value to a stacked gate memory cell, a high voltage is applied to select gate 340, which then causes electrons to tunnel from diffusion region 350 onto floating gate 342. Since floating gate 342 is electrically isolated from the rest of the memory cell structure, the electrons are trapped in floating gate 342. When the memory cell is later read, the charges from the electrons trapped in floating gate 342 affect the amount of current provided by the memory cell, resulting in a low value on bit line 320. Conversely, to program a logic high value to the memory cell, a low voltage is applied to select gate 340, which then causes the electrons on floating gate 342 to gain enough energy to escape from the floating gate onto diffusion region 350 (i.e. the memory cell is discharged or erased). When the memory cell is later read, since the electrons are discharged from floating gate 342, the current read from the memory cell will result in a high value on bit line 320.

Figure 4A:
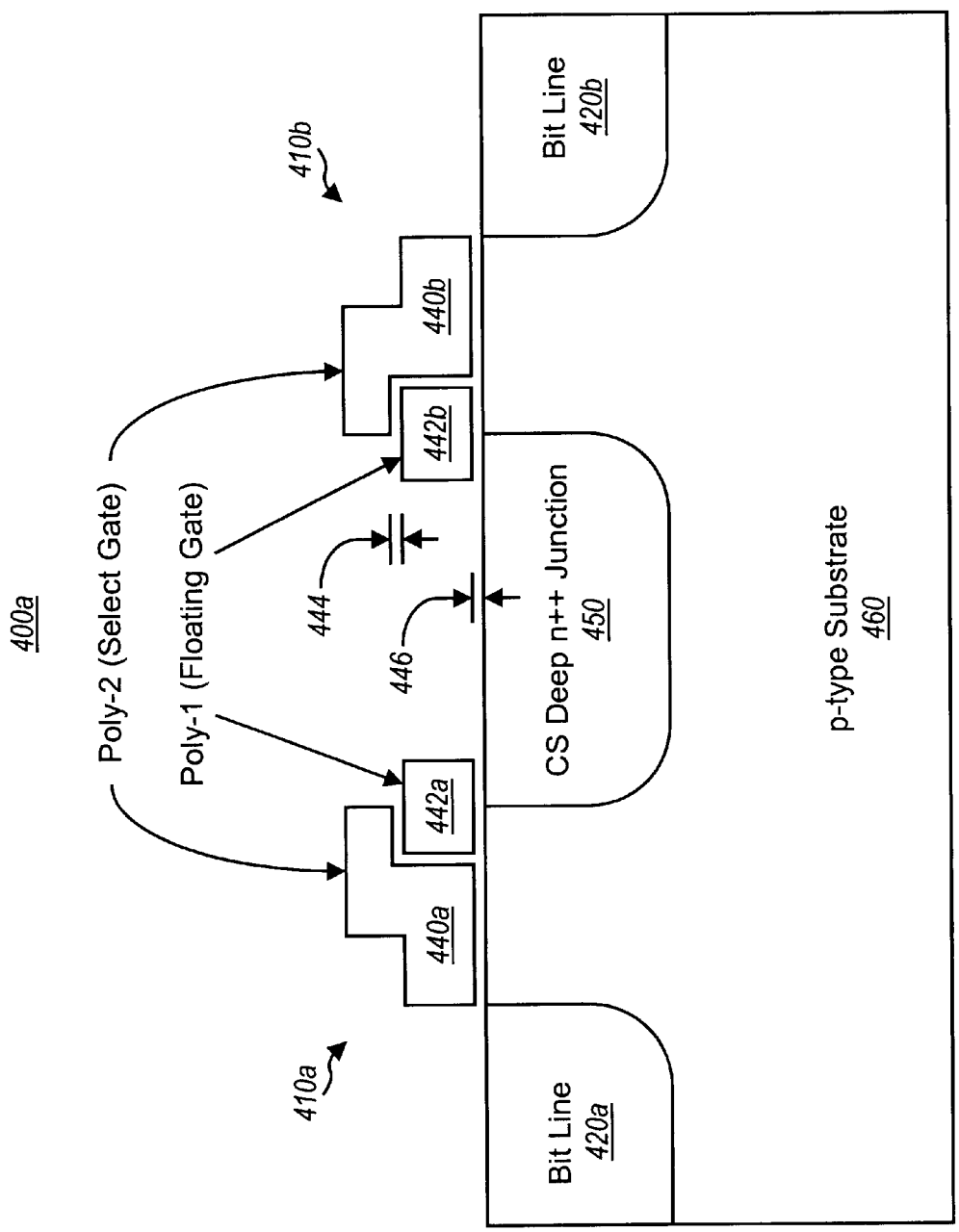
FIGS. 4A and 4B show cross sectional views of a pair of memory cells implemented using split-gate technology, without and with mask misalignment, respectively.

FIG. 4A shows a cross sectional view of a pair of memory cells 400a implemented using split-gate technology. Split-gate memory cells provide several advantages over stacked gate memory cells, such as easier programming (e.g., via use of source-side injection) and reduced likelihood of over-erase. Memory cell pair 400a includes two memory cells 410a and 410b, each of which is implemented with a split-gate transistor having a source that couples to a common source (CS) line 450, a split-gate that couples to a word line, and a drain that couples to a bit line 420. In FIG. 4A, the split-gates for memory cells 410a and 410b are fabricated with no mask misalignment. The transistor to the left of the CS line (for memory cell 410a) is also sometimes referred to as the "down transistor", and the transistor to the right of the CS line (for memory cell 410b) is also sometimes referred to as the "up transistor".

The split-gate for each memory cell 410 comprises a select gate 440 and a floating gate 442. Floating gate 442 is electrically isolated from select gate 440 by an isolation oxide layer 444 and is further isolated from the substrate by an isolation oxide layer 446. The thickness of isolation oxide layer 444 influences the voltage needed to be applied to select gate 440 to program a data value onto floating gate 442. A thicker select gate oxide layer 444 requires a higher voltage to be applied to select gate 440 to program the memory cell. Conversely, a thinner select gate oxide layer 444 allows a lower voltage to be applied to select gate 440 to program a data value onto floating gate 442.

Floating gate 442 is fabricated on top of isolation oxide layer 446, which controls how easily electrons from diffusion region 450 tunnel through isolation oxide layer 446 onto floating gate 442 during programming. A thicker isolation oxide layer 446 makes it more difficult for electrons to tunnel across the oxide layer onto floating gate 442. Conversely, a thinner isolation oxide layer 446 makes it easier for electrons to tunnel across the oxide layer onto floating gate 442. When electrons easily tunnel from diffusion region 450 onto floating gate 442, lattice damage may result in isolation oxide layer 446. The isolation oxide layer is thus typically fabricated with the appropriate thickness to limit the number of electrons that tunnel across the region.

A split-gate memory cell may be programmed in similar manner as for a stacked gate memory cell, as described above. Each memory cell 410 stores a low logic value if floating gate 442 is charged (with electrons) and a high logic value if floating gate 442 is discharged.

Figure 4B:
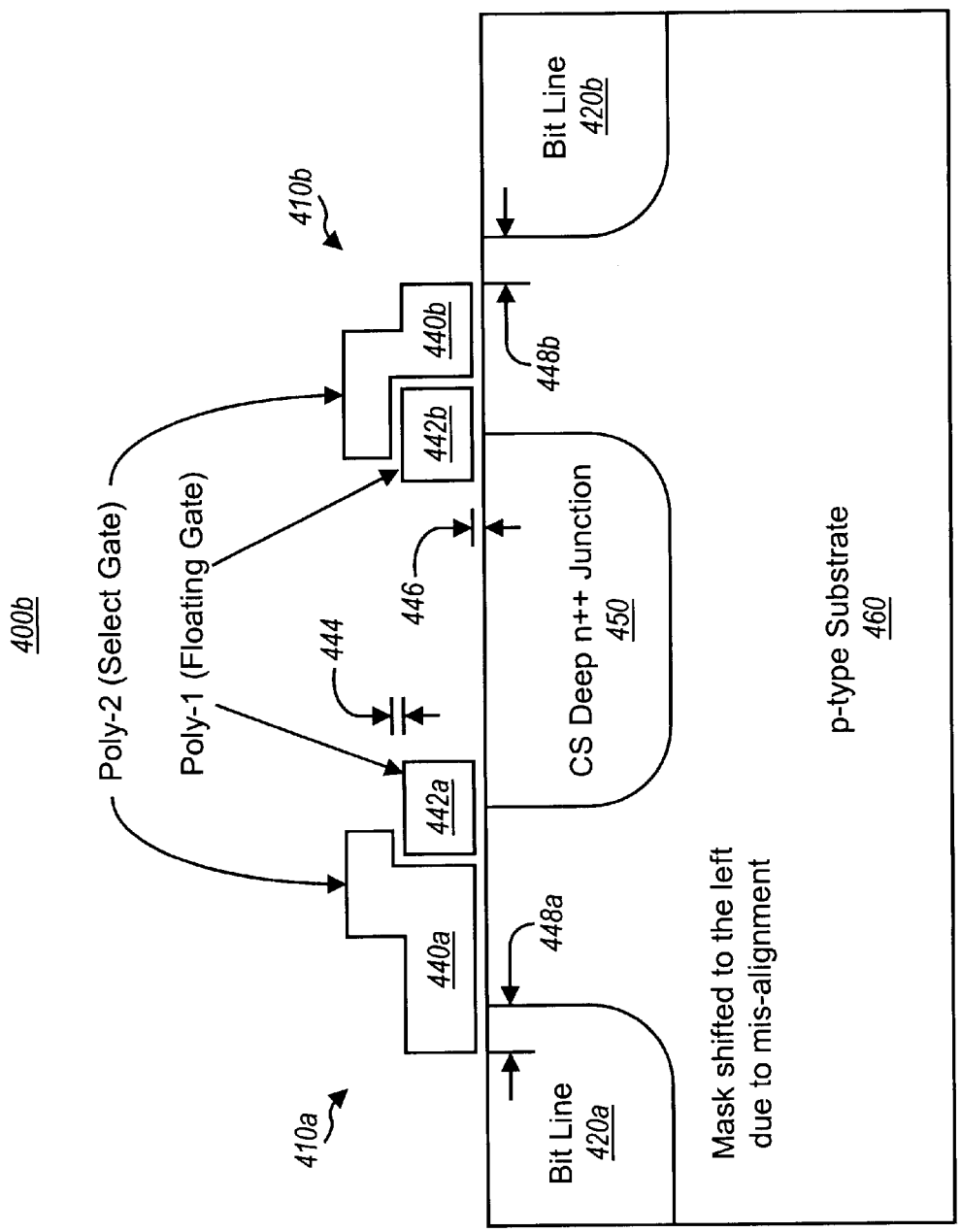

FIG. 4B shows a cross sectional view of a data cell pair 400b implemented with split-gate technology, whereby the two memory cells 410a and 410b are fabricated with mask misalignment. As described above, each data cell in the pair is implemented with a split-gate transistor. In a typical fabrication process (described below), the select gates and the floating gates for the memory cells are fabricated using two masks at two different stages. If the mask for the select gates is not properly aligned to the mask for the floating gates, then a misalignment occurs between the select and floating gates.

As shown in FIG. 4B, because of mask misalignment, select gate 440a for memory cell 410a extends over bit line region 420a (creating a "long split gate"), and select gate 440b for memory cell 410b is also shifted to the left and further away from bit line region 420b (creating a "short split gate"). The distances 448a and 448b represent the amount of mask misalignment. The misalignment changes the physical layout of memory cells 410a and 410b such that they are no longer matched, which would then likely result in different electrical characteristics for the two memory cells. Consequently, the value provided by memory cell 410a for a read will likely be different from the value provided by memory cell 410b.

A split-gate is typically fabricated via a complex fabrication process that may include many process steps. The wafer surface is initially cleaned, and this is followed by a growth of a thin oxide layer, which forms isolation oxide layer 446. This is then followed by a chemical vapor deposition of a poly-silicon material onto the entire wafer. A photo-resist material is then spun onto the wafer. The wafer is then shot with a first mask layer used to form floating gates 442. When the wafer is later exposed to ultraviolet light, the photo-resist layer hardens in the regions where the mask was placed. The wafer is then sent through a chemical bath, which etches away all materials (e.g., the photo-resist and poly-silicon) that were not protected by the hardened photo-resist layer. The wafer is left with the poly-silicon material, which forms floating gates 442. The same set of steps may then be repeated with a second mask to form a second poly-silicon layer for select gates 440.

Misalignment of the select and floating gates occurs when the second mask for the select gates is not aligned to the first mask for the floating gates. As shown in FIG. 4B, because of the mirrored layout of the two split-gate transistors for each memory cell pair, the mask misalignment results in two transistors having different geometries, which then results in transistors having different electrical characteristics. When this occurs, the floating gate charge versus current transfer function is likely to be different for the two memory cells in the pair.

If a single reference cell is used to sense data from the data cells, then this reference cell will likely track only the data cells that are similarly misaligned (i.e., have the same physical layout like the reference cell). This reference cell will likely not track well the other memory cells that are misaligned the opposite way. Thus, if a single reference cell is used to generate the reference value to be compared against the values from both data cells in a mismatched pair, then poor performance may result and erroneous logic values may be provided.

Aspects of the invention provides techniques to more accurately read values stored in data cells. In an aspect, multiple reference cells are used to provide reference values for reading data cells. One reference cell is provided for each set of data cells having similar configuration (i.e., similar layout and orientation). For the split-gate memory cells shown in FIGS. 4A and 4B, two reference cells may be used, with one reference cell being used for first memory cell 410a having a first configuration and another reference cell being used for second memory cell 410b having a second configuration (which is a mirrored image of the first configuration). In general, any number of reference cells may be used to provide reference values for any number of different memory cell configurations.

For split-gate memory design, the two reference cells may be implemented using the same layout and with the same orientation as those of the two data cells in the pair. In this way, any mask misalignment during the fabrication process will similarly affect the reference and data cells. Each reference cell would then have (1) similar physical geometries (in spite of any mask misalignment), (2) similar electrical characteristics, and (3) similar variations in electrical characteristics over temperature and power supply variations, as the corresponding data cell with the same layout and orientation.

Referring back to FIG. 2, the first reference cell 230a is matched to the first data cell 210a (even with mask misalignment) and is used to read the value stored in the first data cell. Similarly, the second reference cell 230b is matched to the second data cell 210b and is used to read the value stored in the second data cell. By using a reference cell having physical layout that is matched to that of the data cell being read, the electrical characteristics of the reference cell will more accurately match the electrical characteristics of the data cell, and improved accuracy in the detection of the data value stored in the data cell may be achieved.

Figure 5:
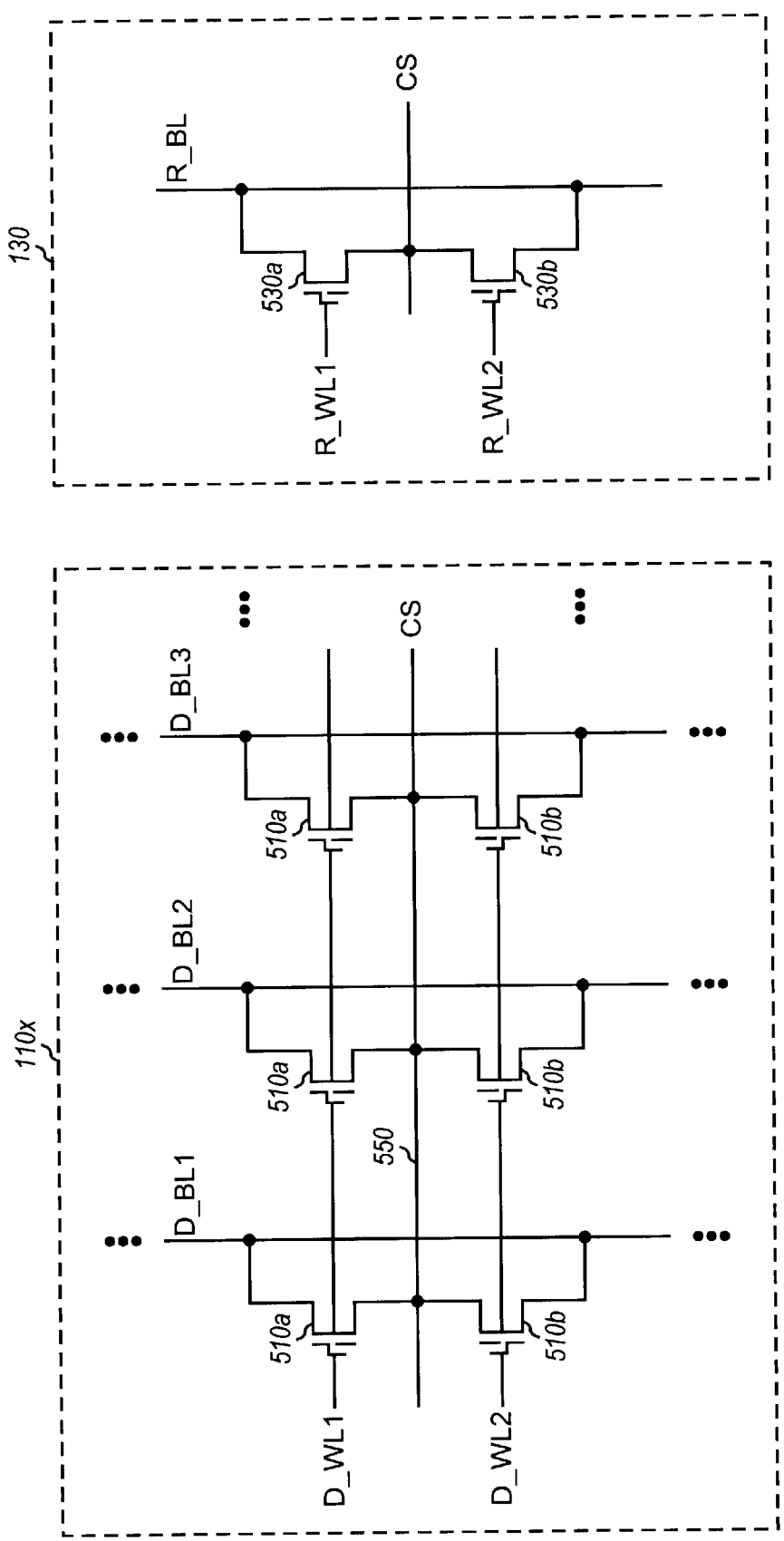
FIG. 5 is a diagram showing a number of data cells and reference cells.

FIG. 5 is a diagram showing a number of data cells and reference cells, in accordance with an embodiment of the invention. Data cells 510 are arranged in pairs along a common source (CS) line 550, with the first data cells 510a being located above the CS line and the second data cells 510b being located below the CS line. A memory array 110x typically includes many rows of data cells, and each row typically includes many more data cell pairs than those shown in FIG. 5.

At least one pair of reference cells is also implemented on the memory device and used for reading the data cells. A pair of reference cells may be provided for the entire memory device, or one pair may be provided for each section of the memory device (e.g., each memory array). Placing the reference cells close to the data cells for which the reference cells will be used may provide better matching between the reference and data cells.

When an address is decoded to access a particular data cell, the proper word line (D_WLx) is asserted and the proper bit line (D_BLx) is also activated. The decoding is performed by decoder 120 and multiplexer 140 shown in FIG. 1. The value from the selected data cell is then provided to the data sense amplifier. Correspondingly, depending on the particular data cell selected (i.e., a first or second data cell), the corresponding (first or second) reference cell is also activated. The value from the selected reference cell is then provided to the reference sense amplifier.

In another aspect, techniques are provided to better match the data paths for the reference and data cells for read operation. As shown in FIG. 2, the values provided by the reference and data cells are routed via respective bit lines 220, amplified by sense amplifiers 250, and compared by comparator 260. The value provided by the data cell is thus processed by a first data path that includes bit line 220a and sense amplifier 250a, and the value provided by the reference cell is processed by a second data path that includes bit line 220b and sense amplifier 250b. Any mismatch between these two data paths may distort the values received by comparator 260, and may degrade performance.

In an embodiment, data sense amplifiers 250a is matched to reference sense amplifier 250b. This matching may be achieved by (1) using the same circuit design for the data and reference sense amplifiers, (2) using the same layout and orientation for the sense amplifiers, (3) matching the polysilicon structure (length and width) and diffusion region (doping concentration and contact) for the sense amplifiers, (4) matching the bit line connection (doping concentration and contact) to the sense amplifiers, (5) matching other physical characteristics of the sense amplifiers and associated elements/components/lines, and so on.

The matched layouts ensure matched data paths for the reference and data values. By properly matching the circuit designs and physical layouts, similar electrical characteristics may be achieved for the two data paths, which would then ensure integrity of the reference and data values from the reference and data cells.

Figure 6:
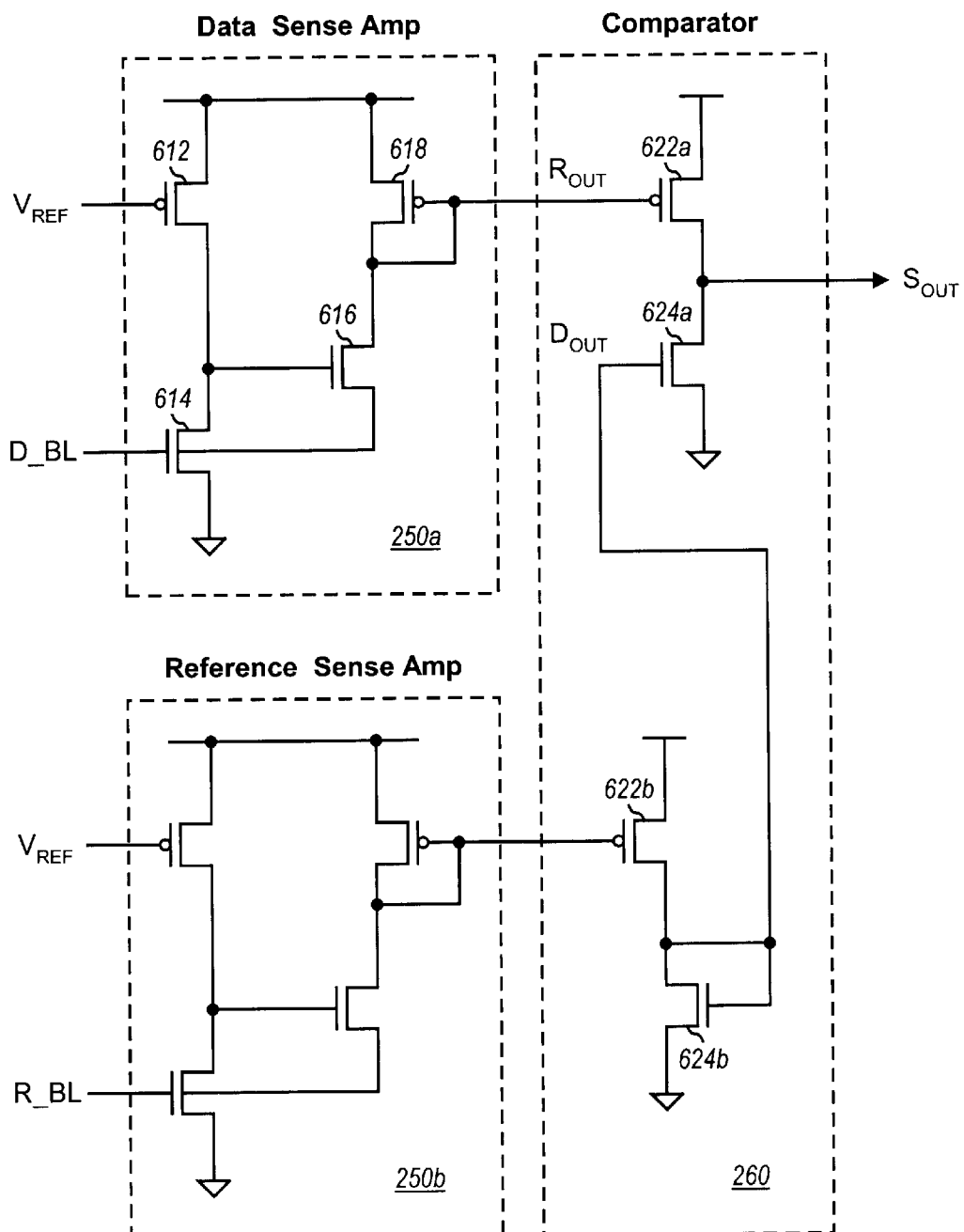
FIG. 6 is a schematic diagram of an embodiment of the sense amplifiers and comparator.

FIG. 6 is a schematic diagram of an embodiment of sense amplifiers 250 and comparator 260. Each sense amplifier 250 includes series-coupled transistors 612 and 614 and series-coupled transistors 616 and 618. P-channel transistor 612 has a drain that couples to the power supply, a gate that couples to a reference voltage, Vref, and a source that couples to the drain of N-channel transistor 614 and to the gate of N-channel transistor 616. The gate of transistor 614 couples to the bit line and to the source of transistor 616, and the source of transistor 614 couples to ground. P-channel transistor 618 has a drain that couples to the power supply and a gate that couples to the source of transistor 618 and to the drain of transistor 616. The source/gate of transistor 618 further comprises the sense amplifier output.

Within each sense amplifier 250, the value on the bit line is amplified by (cascode) transistors 614 and 616. Transistor 618 is a source follower that provides buffering and further drives the sense amplifier output.

Comparator 260 includes two pairs of series coupled transistors 622 and 624, one transistor pair for each input. P-channel transistors 622a and 622b are coupled as a differential amplifier, and N-channel transistors 624a and 624b are coupled as a current-mirror load for the differential amplifier. Transistors 622a and 622b each has a drain that couples to the power supply, a gate that forms an input of the comparator, and a source that couples to the drain of a respective load transistor 624. Transistors 624a and 624b have sources that couple to ground and gates that couple together and to the drain of transistor 624b. The drain of transistor 624a forms the comparator output.

As noted above, sense amplifiers 250a and 250b may be matched (to the extend possible) and the transistors within comparator 260 may also be matched using the factors listed above (e.g., same layout and orientation).

For clarity, the data sensing using dual reference cells have been specifically described for a nonvolatile memory implemented using split-gate technology. These techniques may also be used for nonvolatile memory implemented using stacked gate or some other technology. In general, any number of reference cells may be provided for any number of different possible memory cell configurations that may result from design and/or fabrication imperfection.

Also for clarity, a specific design of the sense amplifiers and comparator are provided herein. Other designs for these circuits may also be implemented and are within the scope of the invention.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for detecting a value stored in a nonvolatile memory cell, comprising:
    selecting a data cell from among a plurality of data cells arranged in pairs, each pair including a first data cell of a first configuration and a second data cell of a second configuration, wherein the selected data cell is of either the first or second configuration;
    selecting a reference cell from among a pair of reference cells, wherein the selected reference cell is of the same configuration as the selected memory cell;
    sensing a first value from the selected data cell with a data sense amplifier;
    sensing a second value from the selected reference cell with a reference sense amplifier, wherein the data sense amplifier is matched to the reference sense amplifier;
    comparing the sensed first and second values; and
    providing an output value based on a result of the comparing.

2. The method of claim 1, wherein each of the first and second configurations is associated with a respective layout and orientation.

3. The method of claim 2, wherein the first and second configurations are associated with layouts that are mirrored image of each other.

4. The method of claim 1, wherein each of the plurality of data cells and each of the reference cells is implemented with a split-gate transistor.

5. The method of claim 1, wherein each of the plurality of data cells and each of the reference cells is implemented with a stacked gate transistor.

6. The method of claim 1, wherein the data and reference cells of the first configuration have similar electrical characteristics and the data and reference cells of the second configuration have similar electrical characteristics.

7. The method of claim 6, wherein the electrical characteristics for the data and reference cells of the first configuration are potentially different from the electrical characteristics for the data and reference cells of the second configuration.

8. A memory device comprising:
    a plurality of data cells arranged in pairs, each data cell pair including a first data cell having a first configuration and a second data cell having a second configuration;
    a pair of reference cells, the reference cell pair including a first reference cell of the first configuration and a second reference cell of the second configuration;

a data sense amplifier operatively coupled to the plurality of data cells, the data sense amplifier operative to receive and amplify a signal from a selected data cell and provide a first amplified signal;

a reference sense amplifier operatively coupled to the pair of reference cells, the reference sense amplifier operative to receive and amplify a signal from a selected reference cell of the same configuration as the selected data cell and provide a second amplified signal, wherein the data sense amplifier is matched to the reference sense amplifier; and a comparator operatively coupled to the data sense amplifier and the reference sense amplifier, the comparator operable to compare the first amplified signal for the selected data cell against the second amplified signal for the selected reference cell and provide an output value based on a result of the comparison.

9. The memory device of claim 8, wherein the data sense amplifier and the reference sense amplifier have same circuit design.

10. The memory device of claim 8, wherein the data cells of the first configuration have similar electrical characteristics and the data cells of the second configuration have similar electrical characteristics.

11. The memory device of claim 8, wherein the data cells and the reference cells are implemented with split-gate transistors.

12. The memory device of claim 8, wherein the data cells and the reference cells are implemented with stacked gate transistors.

13. The memory device of claim 8, wherein the first and second data cells in each pair have mirrored configuration.

14. The memory device of claim 8, wherein a first signal path between the data sense amplifier and the comparator is matched to a second signal path between the reference sense amplifier and the comparator.

15. The memory device of claim 14, wherein a third signal path between the plurality of data cells and the data sense amplifier is matched to a fourth signal path between the pair of reference cells and the reference sense amplifier.

16. A memory device comprising:
    a plurality of data cells of a plurality of configurations, wherein data cells of each configuration have similar electrical characteristics;
    a plurality of reference cells, one reference cell for each of the plurality of configurations;
    a data sense amplifier operatively coupled to the plurality of data cells, the data sense amplifier operative to receive and amplify a signal from a selected data cell and provide a first amplified signal:
    a reference sense amplifier operatively coupled to the plurality of reference cells, the reference sense amplifier operative to receive and amplify a signal from a selected reference cell of the same configuration as the selected data cell and provide a second amplified signal, wherein the data sense amplifier is matched to the reference sense amplifier; and
    a comparator operatively coupled to the data sense amplifier and the reference sense amplifier, the comparator operable to compare the first amplified signal for the selected data cell against the second amplified signal for the selected reference cell and provide an output value based on a result of the comparison.

17. The memory device of claim 16, wherein each of the plurality of configurations is associated with a respective layout and orientation.

18. The memory device of claim 16, wherein each of the plurality of data cells and each of the plurality of reference cells is implemented with a split gate transistor.

19. The memory device of claim 16, wherein each of the plurality of data cells and each of the plurality of reference cells is implemented with a stacked gate transistor.

20. The memory device of claim 9, wherein the data sense amplifier and the reference sense amplifier have same layout and orientation.

* * * * *